US011652098B2

(12) United States Patent
Wang et al.

(10) Patent No.: US 11,652,098 B2
(45) Date of Patent: May 16, 2023

(54) TRANSISTOR STRUCTURE FOR ELECTROSTATIC PROTECTION AND METHOD FOR MANUFACTURING SAME

(71) Applicant: Joulwatt Technology (Hangzhou) Co., Ltd., Hangzhou (CN)

(72) Inventors: Weihuai Wang, Hangzhou (CN); Yang Lu, Hangzhou (CN)

(73) Assignee: JOULWATT TECHNOLOGY (HANGZHOU) CO., LTD., Hangzhou (CN)

( * ) Notice: Subject to any disclaimer, the term of this patent is extended or adjusted under 35 U.S.C. 154(b) by 156 days.

(21) Appl. No.: 17/142,596

(22) Filed: Jan. 6, 2021

(65) Prior Publication Data

US 2021/0210480 A1 Jul. 8, 2021

(30) Foreign Application Priority Data

Jan. 6, 2020 (CN) .................. 202010010844.X
Jan. 6, 2020 (CN) .................. 202010011508.7

(51) Int. Cl.
*H01L 27/02* (2006.01)

(52) U.S. Cl.
CPC .................. *H01L 27/0262* (2013.01)

(58) Field of Classification Search
CPC ............ H01L 27/0262; H01L 27/0255; H01L 29/7817; H01L 29/7835; H01L 29/7816; H01L 29/7393; H01L 27/0259; H01L 27/0928
See application file for complete search history.

(56) References Cited

U.S. PATENT DOCUMENTS 9,397,090 B1* 7/2016 Chen ................ H01L 27/027
2020/0328592 A1* 10/2020 Hung ................ H01L 29/861

* cited by examiner

*Primary Examiner* — Wasiul Haider
(74) *Attorney, Agent, or Firm* — Treasure IP Group, LLC

(57) ABSTRACT

Disclosed are a transistor structure for electrostatic protection and a method for manufacturing the same. The transistor structure comprises: a doped region in a substrate; field oxide layers; a first N-type well region, a P-type well region and a second N-type well region in the doped region and spaced in sequence; a first polycrystalline silicon layer and a second polycrystalline silicon layer covering part of the P-type well region; a first N+ region and a first P+ region respectively formed in the first N-type well region and the second N-type well region second P+ region and the second N+ region are close to the first N+ region and the first P+ region, respectively. The structure may change a current path under forward/reverse operation; thus, a device keeps a good electrostatic protection capability and high robustness.

11 Claims, 10 Drawing Sheets

TRANSISTOR STRUCTURE FOR ELECTROSTATIC PROTECTION AND METHOD FOR MANUFACTURING SAME

CROSS-REFERENCE TO RELATED APPLICATIONS

The present application claims the priority of Chinese Patent Application No. 202010010844.X, filed on Jan. 6, 2020 and entitled by "TRANSISTOR STRUCTURE FOR ELECTROSTATIC PROTECTION AND METHOD FOR MANUFACTURING SAME", and the priority of Chinese Patent Application No. 202010011508.7, filed on Jan. 6, 2020 and entitled by "TRANSISTOR STRUCTURE FOR ELECTROSTATIC PROTECTION AND METHOD FOR MANUFACTURING SAME", which are incorporated herein by reference in its entirety.

FIELD OF TECHNOLOGY

The present invention relates to a technical field of semiconductor technology, in particular to a transistor structure for electrostatic protection and a method for manufacturing the same.

BACKGROUND

Electro-Static Discharge (ESD), an objective natural phenomenon, accompanies an entire cycle of a product. During manufacturing, packaging, testing and applying stages of a chip, certain charges will be accumulated in an external environment and an internal structure of the chip, resulting in electrostatic threat to the chip at any time. Therefore, an ESD protective device needs to be placed on each pin in design of the chip for protecting a power-off state and a power-on state of the chip.

In practical design, a silicon controlled rectifier (SCR) structure is often used as an ESD protective device for a high-voltage pin. Although an SCR structure has strong robustness in electrostatic protection under a human body model, the structure may cause premature damage of the device due to a base region stretching effect and cannot play a role in protection under an assembly charging model.

FIG. 1 shows a sectional schematic diagram of a silicon controlled rectifier structure for electrostatic protection in the prior art. As shown in FIG. 1, the silicon controlled rectifier structure includes a substrate 101, an N-type shallowly doped region 102 located in an upper portion of the substrate 101, a P-type well region 103 and an N-type well region 104 located in an upper portion of the doped region 102, wherein a first P+ region 121 and a first N+ region 131 are formed in the P-type well region 103, a second P+ region 122 and a second N+ region 132 are formed in the N-type well region 104, a field oxide layer 111, a field oxide layer 112, a field oxide layer 113, a field oxide layer 114 and a field oxide layer 115 are formed on a surface of the substrate 101, and a gate oxide layer 106 and a polycrystalline silicon layer 107 are further formed above the field oxide layer 113. As shown in the figure, when a forward voltage is applied to an anode of the silicon controlled rectifier structure, a PN junction between the doped region 102 and the P-type well region 103 is reversely broken down, resulting in that a concentration of negative charges in the doped region 102 is increased, an electric field of the silicon controlled rectifier structure is changed, a maximum field intensity position is transferred from the doped region 102 and the P-type well region 103 to the doped region 102 and the N-type well region 104, a base region stretching effect occurs, resulting in an uneven electric current and then a damage to the silicon controlled rectifier structure, and accordingly, a device connected to the anode cannot be protected against electrostatic.

SUMMARY OF THE INVENTION

In view of the problems mentioned above, the objective of the present invention is to provide an optimized transistor structure for electrostatic protection and a method for manufacturing the same. By improving a silicon controlled rectifier structure, a current path under forward operation and reverse operation can be changed, thereby weakening a base region stretching effect, and forming good electrostatic protection for a device.

According to a first aspect of the present disclosure, there is provided a transistor structure for electrostatic protection, comprising: a substrate and a doped region formed in an upper portion of the substrate; a plurality of field oxide layers formed on a surface of the substrate; a first N-type well region, a P-type well region and a second N-type well region formed in an upper portion of the doped region and spaced in sequence; a first polycrystalline silicon layer and a second polycrystalline silicon layer formed on the surface of the substrate and covering part of the P-type well region; a first N+ region and a first P+ region formed in the first N-type well region and the second N-type well region, respectively; and a second N+ region and a second P+ region formed in the P-type well region, wherein the second P+ region in the P-type well region is close to the first N+ region, and the second N+ region in the P-type well region is close to the first P+ region.

Alternatively, a first anode and a second anode of the transistor structure are led out from the first N+ region and the first P+ region, respectively; and the second N+ region, the second P+ region, the first polycrystalline silicon layer and the second polycrystalline silicon layer are connected together at a connection node, which serves as a cathode of a semiconductor structure.

Alternatively, the transistor structure for electrostatic protection further comprises: a third N+ region formed in the P-type well region, wherein the third N+ region is connected to the cathode and close to the first N+ region.

Alternatively, the third N+ region is in direct contact with the second P+ region.

Alternatively, the third N+ region is separate with the second P+ region, and a first drift region located between the first N-type well region and the P-type well region has a larger length than a length of a second drift region located between the second N-type well region and the P-type well region.

Alternatively, the doped region is a shallowly doped N-type region.

Alternatively, a first drift region located between the first N-type well region and the P-type well region and a second drift region located between the second N-type well region and the P-type well region have equal lengths.

Alternatively, when the transistor structure works under forward operation, a conductive channel is formed between the second anode and the cathode; and when the transistor structure works under reverse operation, a conductive channel is formed between the cathode and the first anode.

Alternatively, the first polycrystalline silicon layer is located above the first field oxide layer between the P-type well region and the first N-type well region; and the second polycrystalline silicon layer is located above the second field oxide layer between the P-type well region and the second N-type well region.

Alternatively, the transistor structure comprises a first semiconductor structure and a second semiconductor structure, wherein the first semiconductor structure comprises the substrate, the doped region, the first N-type well region, the P-type well region, the first N+ region, the first polycrystalline silicon layer and the first field oxide layer; and the second semiconductor structure comprises the substrate, the doped region, the second N-type well region, the P-type well region, the first P+ region, the second P+ region, the second N+ region, the second polycrystalline silicon layer and the second field oxide layer.

Alternatively, the transistor structure comprises a first semiconductor structure and a second semiconductor structure, wherein the first semiconductor structure comprises the substrate, the doped region, the first N-type well region, the P-type well region, the first N+ region, the first polycrystalline silicon layer and the first field oxide layer; and the second semiconductor structure comprises the substrate, the doped region, the second N-type well region, the P-type well region, the first P+ region, the second P+ region, the second N+ region, the third N+ region, the second polycrystalline silicon layer and the second field oxide layer.

According to a second aspect of the present disclosure, there is provided a method for manufacturing a transistor structure for electrostatic protection, comprising: forming a substrate and a doped region located in an upper portion of the substrate; forming a plurality of field oxide layers on a surface of the substrate; forming a first N-type well region, a P-type well region and a second N-type well region which are located in an upper portion of the doped region and spaced in sequence; forming a first polycrystalline silicon layer and a second polycrystalline silicon layer which are located on the surface of the substrate and cover part of the P-type well region; forming a first N+ region and a first P+ region which are located in the first N-type well region and the second N-type well region, respectively; and forming a second N+ region and a second P+ region which are located in the P-type well region, wherein the second P+ region in the P-type well region is close to the first N+ region, and the second N+ region in the P-type well region is close to the first P+ region.

Alternatively, the method for manufacturing the transistor structure for electrostatic protection further comprises: forming a first anode, a second anode and a cathode of the transistor structure, wherein the first anode and the second anode are connected to the first N+ region and the first P+ region, respectively; the cathode is connected to the second N+ region, the second P+ region, the first polycrystalline silicon layer and the second polycrystalline silicon layer.

Alternatively, the method for manufacturing the transistor structure for electrostatic protection further comprises: forming a third N+ region located in the P-type well region, wherein the third N+ region is connected to the cathode and close to the first N+ region.

Alternatively, according to the method for manufacturing the transistor structure for electrostatic protection, the third N+ region is in direct contact with the second P+ region.

Alternatively, according to the method for manufacturing the transistor structure for electrostatic protection, the third N+ region is separate with the second P+ region, and a first drift region located between the first N-type well region and the P-type well region has a larger length than a length of a second drift region located between the second N-type well region and the P-type well region.

Alternatively, according to the method for manufacturing the transistor structure for electrostatic protection, the doped region is a shallowly doped N-type region.

Alternatively, according to the method for manufacturing the transistor structure for electrostatic protection, a first drift region located between the first N-type well region and the P-type well region and a second drift region located between the second N-type well region and the P-type well region have equal lengths.

Alternatively, according to the method for manufacturing the transistor structure for electrostatic protection, when the transistor structure works under forward operation, a conductive channel is formed between the second anode and the cathode; and when the transistor structure works under reverse operation, a conductive channel is formed between the cathode and the first anode.

According to the transistor structure for electrostatic protection and the method for manufacturing the same provided by the present disclosure, the first N-type well region, the P-type well region and the second N-type well region which are spaced in sequence are formed in the upper portion of the substrate, the first N+ region and the first P+ region are separately formed in the first N-type well region and the second N-type well region, the second P+ region close to the first N+ region and the second N+ region close to the first P+ region are formed in the P-type well region, so as to change a PN junction structure at each position of the transistor structure, such that when the transistor works, a conductivity feature of each position is changed, then the current path of the transistor structure under forward operation and reverse operation can be changed, the transistor structure may effectively suppress the base region stretching effect under forward operation and may provide better electrostatic protection capability under reverse operation, thereby improving the electrostatic protection capability of the entire transistor structure, and the process is easy to implement and operate.

Preferably, under forward operation, the current path between the second anode and the cathode is easier to be conductive to form a current channel for fully suppressing the base region stretching effect; and under reverse operation, a current channel is formed between the cathode and the first anode to provide better electrostatic protection capability.

BRIEF DESCRIPTION OF THE DRAWINGS

The above and other objectives, features and advantages of the present invention will become more apparent from the description below with reference to the accompanying drawings on the embodiments of the present disclosure. In the figures.

DESCRIPTION OF THE EMBODIMENTS

Various embodiments of the present disclosure will be described in detail below with reference to the accompanying drawings. In each accompanying drawing, the same element is denoted by the same or similar reference number. For clarity, each part in the accompanying drawings is not drawn to scale. In addition, some well-known parts may not be shown. For brevity, a semiconductor structure obtained after several steps may be described in one figure.

During description of a structure of a device, when one layer or one region is referred to as being located "on" or "above" another layer or another region, the layer or the region may be directly located above another layer or another region, or other layers or regions may be provided between the layer or the region and another layer or another region. Further, under the condition that the device is flipped, the layer or the region will be located "under" or "below" another layer or another region.

In order to describe a situation of being directly located above another layer or another region, the expression of "A is directly located on B" or "A is located on and adjacent to B" will be employed herein. In the present application, "A is directly located in B" means that A is located in B, and A is directly adjacent to B, rather than A is in a doped region formed in B.

Unless otherwise specified hereinafter, each layer or region of the semiconductor device may be composed of materials well known to those skilled in the art. The semiconductor materials include, for example, group III-V semiconductors such as GaAs, InP, GaN and SiC, and group IV semiconductors such as Si and Ge. A grid conductor and an electrode layer may be formed by various electrically conductive materials, for example, a metal layer, a polycrystalline silicon doped layer, or a laminated grid conductor including the metal layer and the polycrystalline silicon doped layer, or other electrically conductive materials, for example, TaC, TiN, TaSiN, HfSiN, TiSiN, TiCN, TaAlC, TiAlN, TaN, PtSix, Ni$_3$Si, Pt, Ru, W and a combination of the various electrically conductive materials.

In the present application, the term "semiconductor structure" refers to a collective name of the entire semiconductor structure formed in the various steps of manufacturing the semiconductor device, including all layers or regions that have been formed. The term "laterally extending" refers to extending in a direction that is approximately perpendicular to a depth direction of a groove.

A specific implementation of the present disclosure will be further described in detail in combination with the accompanying drawings and the embodiments.

Figure 2:
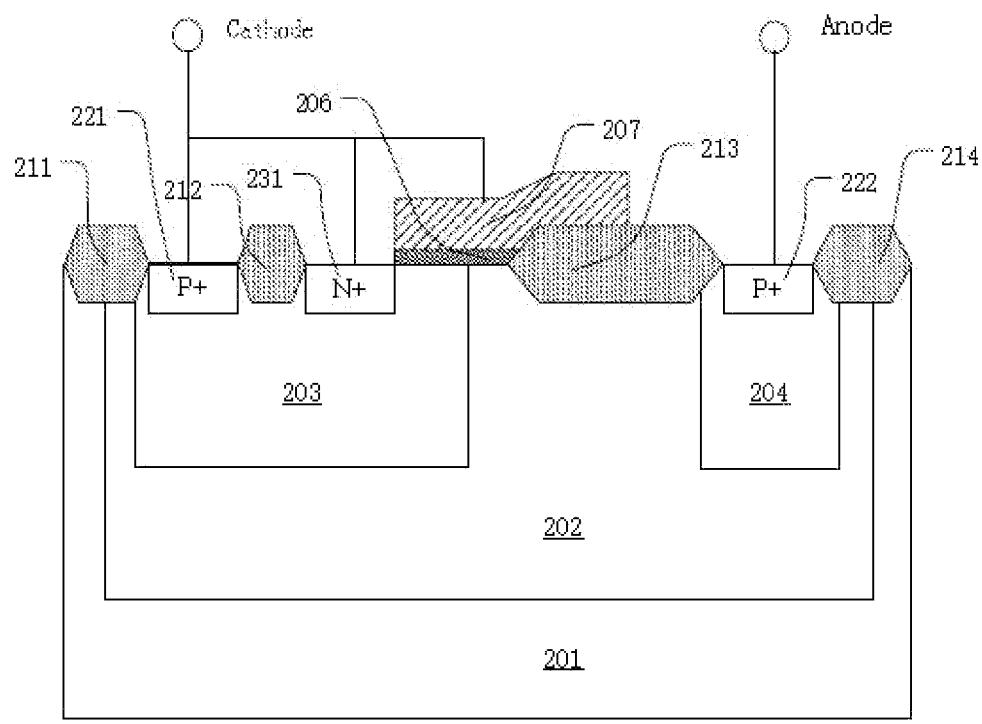
FIG. 2 shows a sectional structural schematic diagram of an insulated gate bipolar transistor for electrostatic protection.

FIG. 2 shows a sectional structural schematic diagram of an insulated gate bipolar transistor for electrostatic protection.

Figure 1:
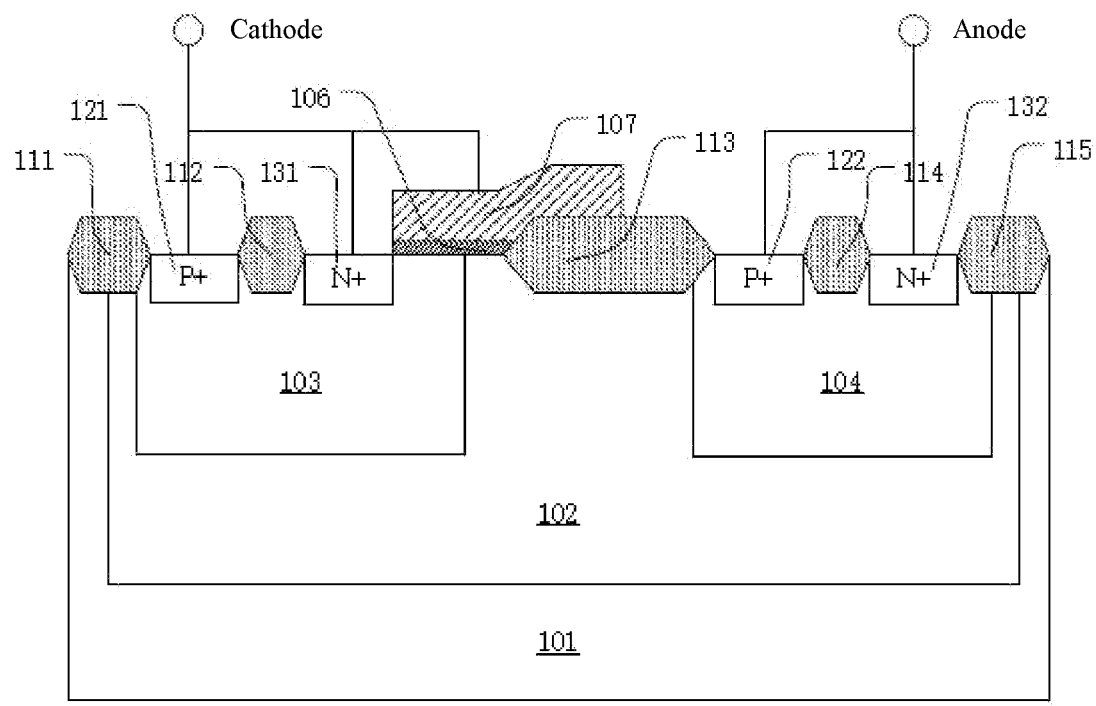
FIG. 1 shows a sectional schematic diagram of a silicon controlled rectifier structure for electrostatic protection in the prior art.

As description above to FIG. 1, a silicon controlled rectifier structure will have a base region stretching effect under forward operation, resulting in a damage to the device and incapability of good electrostatic protection, such that the silicon controlled rectifier structure is improved to form an insulated gate bipolar transistor (IGBT) structure shown in FIG. 2, and an N+ region at a drain end of the SCR structure is directly removed, so as to suppress the base region stretching effect.

As shown in FIG. 2, the IGBT structure comprises a substrate 201, an N-type shallowly doped region 202 located in an upper portion of the substrate 201, and a P-type well region 203 and an N-type well region 204 located in an upper portion of the doped region 202, wherein a first P+ region 221 and a first N+ region 231 are formed in the P-type well region 203, a second P+ region 222 is formed in the N-type well region 204, a field oxide layer 211, a field oxide layer 212, a field oxide layer 213 and a field oxide layer 214 are formed on a surface of the substrate 201, and a gate oxide layer 206 and a polycrystalline silicon layer 207 are further formed above the field oxide layer 213. An anode of the IGBT structure is led out from the second P+ region 222 in the N-type well region 204, and a cathode of the IGBT structure is connected to the first P+ region 221, the first N+ region 231 and the polycrystalline silicon layer 207.

When a forward voltage is applied to the anode of the IGBT structure, that is, under forward operation, a current channel is formed through the anode, the second P+ region 222, the N-type well region 204, the doped region 202, the P-type well region 203, the first N+ region 231 to the cathode, making the IGBT device conducted and achieving electrostatic protection. At the moment, due to the fact that the N-type well region 204 at the anode only has one P+ region, a PN junction is formed between the N-type well region 204 and the doped region 202, when a PN junction between the doped region 202 and the P-type well region 203 is reversely broken down, the PN junction between the N-type well region 204 and the doped region 202 is forward conducted, such that a small number of positive charges are injected into a drift region, that is, a charge concentration in the doped region 202 is adjusted and an electric field is adjusted, thereby suppressing the base region stretching effect and then achieving good electrostatic protection capability under an assembly charging model.

However, when the IGBT structure works under reverse operation, that is, when the cathode is connected to a high voltage, due to the fact that the N-type well region 204 only has the P+ region, a diode conduction path form P to N in the SCR structure does not exist. Therefore, when the IGBT structure works under reverse operation, a P-N-P path is formed through the cathode, the first P+ region 221, the P-type well region 203, the doped region 202, the N-type well region 204, the second P+ region 222 to the anode, an avalanche breakdown needs to happen on the PN junction formed between the N-type well region 204 and the second P+ region 222, and generally, a voltage value required by the avalanche breakdown in the process is large, for example, about 10V, which brings great trouble to the process design, and is inconvenient to be implemented.

Figure 3:
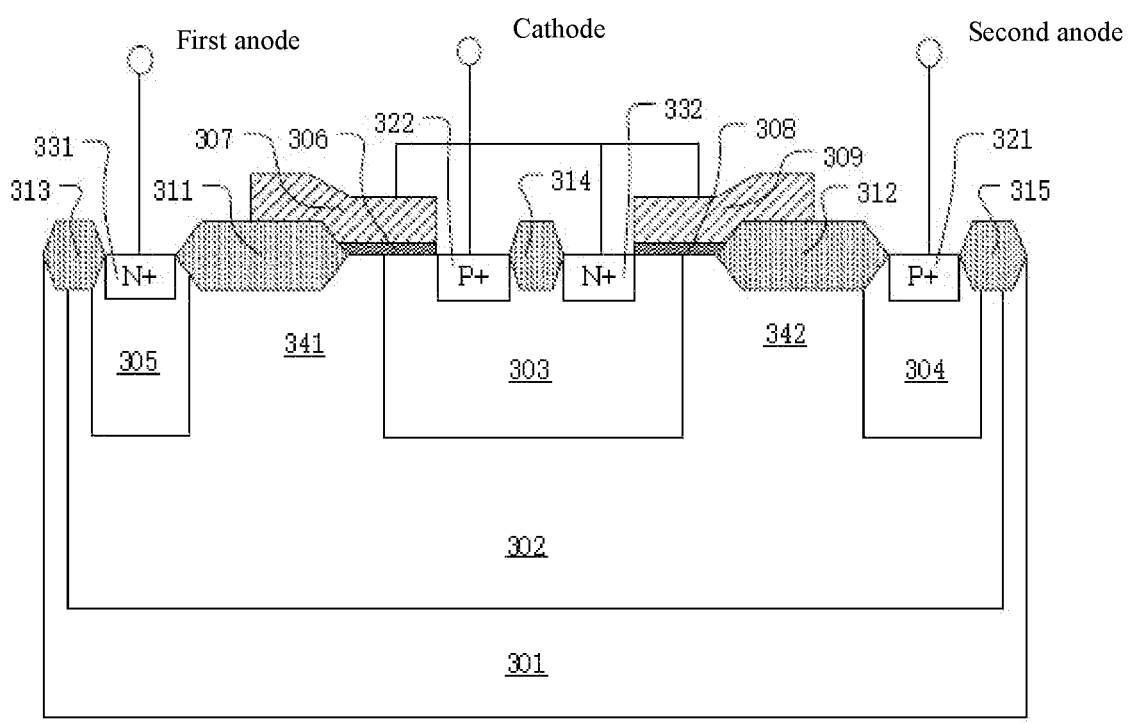
FIG. 3 shows a sectional schematic diagram of a transistor structure for electrostatic protection according to a first embodiment of the present disclosure.

So the IGBT structure is further improved to form the transistor structure shown in FIG. 3, under a condition that a good electrostatic protection capability of the IGBT is kept, a reverse characteristic thereof is changed, such that the transistor structure may play a role in good electrostatic protection under reverse operation. FIG. 3 shows a sectional schematic diagram of a transistor structure for electrostatic protection according to the embodiment of the present disclosure.

As shown in FIG. 3, the transistor structure comprises a substrate 301, a doped region 302 located in an upper portion of the substrate 301, and a P-type well region 303, a first N-type well region 305 and a second N-type well region 304 located in an upper portion of the doped region 302. The doped region 302 is an N-type shallowly doped region. The first N-type well region 305, the P-type well region 303 and the second N-type well region 304 are spaced in sequence, a first drift region 341 is provided between the first N-type well region 305 and the P-type well region 303, a second drift region 342 is provided between the second N-type well region 304 and the P-type well region 303, and the first drift region 341 and the second drift region 342 have equal lengths.

Further, a first N+ region 331 and a first P+ region 321 are separately formed in the first N-type well region 305 and the second N-type well region 304, and a second P+ region 322 and a second N+ region 332 are formed in the P-type well region 303.

Further, a first field oxide layer 311 is formed on a surface, between the first N+ region 331 and the second P+ region 322, of the substrate 301, a second field oxide layer 312 is formed on a surface, between the second N+ region 332 and the first P+ region 321, of the substrate 301, in addition, a third field oxide layer 313 grows on the other side of the first N+ region 331, a fourth field oxide layer 314 is formed between the second P+ region 322 and the second N+ region 332, a fifth field oxide layer 315 is formed on the other side of the first P+ region 321, and a growth of each field oxide layer is achieved by a convention process.

In addition, a first polycrystalline silicon layer 307 is further formed above the first field oxide layer 311, and a first gate oxide layer 306 is formed between the first polycrystalline silicon layer 307 and the first field oxide layer 311, which is not described in detail herein. Similarly, a second polycrystalline silicon layer 309 is further formed above the second field oxide layer 312, and a second gate oxide layer 308 is formed between the second polycrystalline silicon layer 309 and the second field oxide layer 312. The first polycrystalline silicon layer 307 and the second polycrystalline silicon layer 309 both cover part of a surface of the P-type well region 303.

Further, a first anode and a second anode of the transistor structure are led out from the first N+ region 331 and the first P+ region 321, respectively; and the second N+ region 332, the second P+ region 322, the first polycrystalline silicon layer 307 and the second polycrystalline silicon layer 309 are connected at a connection node, which serves as a cathode of the semiconductor structure.

As shown in FIG. 3, when the transistor structure is under forward operation, that is, when an anode voltage is greater than a cathode voltage, a current channel which may be formed between the first anode and the cathode have to pass through the first N+ region 331, the first N-type well region 305, the doped region 302, the P-type well region 303 and the second P+ region 322, that is, passing through an N-N-P-P structure equivalently, and a current channel which may be formed between the second anode and the cathode have to pass through the first P+ region 321, the second N-type well region 304, the doped region 302, the P-type well region 303 and the second N+ region 332, that is, passing through a P-N-P-N structure equivalently. Therefore, the current channel between the second anode and the cathode may pass through an N-P junction which needs to be broken down and is located between the doped region 302 and the P-type well region 303, the current channel between the first anode and the cathode needs to form a reverse breakdown between the doped region 302 and the P-type well region 303 as well as the second P+ region 322, but a concentration of the second P+ region is very high and make it hard to achieve the breakdown, a current channel therefore may not formed between the first anode and the cathode, such that when the forward voltage is applied to the anode, the current channel between the second anode and the cathode is conducted firstly, the current channel is formed between the second anode and the cathode under forward operation, which is consistent with the IGBT structure described in FIG. 2, the base region stretching effect may be effectively suppressed, and the electrostatic protection capability is good.

When the transistor structure works under reverse operation, that is, when the cathode voltage is greater than the anode voltage, as described in FIG. 2, a path between the cathode and the second anode needs to pass through a high-voltage avalanche breakdown, a P-N diode path formed between the cathode and the first anode needs to pass through the second P+ region 322, the P-type well region 303, the doped region 302, the first N-type well region 305 and the first N+ region 331, due to a forward conductivity characteristic of a diode, the P-N diode path is more easily conducted than the path with the avalanche breakdown, such that under reverse operation, a current path is formed between the cathode and the first anode, and accordingly, the transistor structure has good reverse characteristic and strong electrostatic protection capability.

In one embodiment, the transistor structure comprises a first semiconductor structure and a second semiconductor structure, wherein the first semiconductor structure comprises the substrate 301, the doped region 302, the first N-type well region 305, the P-type well region 303, the first N+ region 331, the first polycrystalline silicon layer 307 and the first field oxide layer 311; and the second semiconductor structure comprises the substrate 301, the doped region 302, the second N-type well region 304, the P-type well region 303, the first P+ region 321, the second P+ region 322, the second N+ region 332, the second polycrystalline silicon layer 309 and the second field oxide layer 312. Further, the first semiconductor structure is a lateral diffused MOS (LDMOS) structure without an N+ region at a drain end, that is, a lateral double-diffused field effect transistor, and the second semiconductor structure is the IGBT structure.

Therefore, it may be approximately deemed that a left half part of the transistor structure is the LDMOS structure and a right half part thereof is the IGBT structure, but the drain end of the LDMOS structure of the left half part is improved by removing one N+ region and an oxide layer which are adjacent to the second P+ region 322, thus influencing a current path of the semiconductor structure of the left half part under forward operation, an original N-P-N conduction path is lost, the current channel between the first anode and the cathode is extremely difficult to be conducted, furthermore, due to the fact that the first drift region 341 and the second drift region 342 have equal lengths, when the device works under forward operation, the right IGBT structure begin to operate earlier than the left LDMOS structure, and when the device works under reverse operation, the right IGBT structure may rely on the left LDMOS structure to form a diode path. In this way, a novel transistor structure has both the electrostatic protection capability and the good reverse characteristic, suppresses the base region stretching effect and further solves the problem of the poor reverse characteristic of the IGBT structure. A process for manufacturing the transistor structure is compatible with an existing process, and easy to operate and implement. In addition, compared with a traditional combination of the LDMOS structure and the IGBT structure, the transistor structure of the embodiment omits the manufacturing of the drain end structure of the LDMOS, resulting in that the transistor structure is reduced in size to a great degree and is more miniaturized, an occupation area of a transistor is reduced, the manufacturing process cost is saved on and batch production is more convenient.

In one embodiment, when a traditional transistor structure combining the LDMOS structure and the IGBT structure is used and the first drift region 341 has a length slightly greater than that of the second drift region 342, under forward operation, due to a difference in lengths of the two drift regions, the current channel between the second anode and the cathode may be conducted firstly to achieve the same effect as this embodiment, but the drift region of the right semiconductor structure of the traditional structure is short in the traditional structure, and therefore a breakdown voltage is reduced, and an application range of the whole device is narrowed. In the embodiment of the present disclosure, although a current channel is also formed between the second anode and the cathode firstly, the drift regions have the equal lengths, such that the breakdown voltage is not reduced, and compared with the embodiment mentioned above, the breakdown voltage is guaranteed, and a forward conductivity characteristic is good. In addition, compared with the traditional manufacturing process, the embodiment removes the N+ region at the drain end of the LDMOS structure and the oxide layer between the N+ region and the second P+ region 322, thereby reducing the size of the transistor structure, and making it easier to manufacture.

The semiconductor device structure shown in FIG. 3 is manufactured by means of the process steps shown in FIGS. 4a-4e to further improve the electrostatic protection capability of the insulated gate bipolar transistor, and a manufacturing method is described below.

FIGS. 4a-4e show a sectional schematic diagram of each stage of a method for manufacturing the transistor structure for electrostatic protection according to the embodiment of the present disclosure. A manufacturing flow of the transistor structure of the embodiment of the present disclosure is described below in conjunction with FIGS. 4a-4e.

Figure 4A:
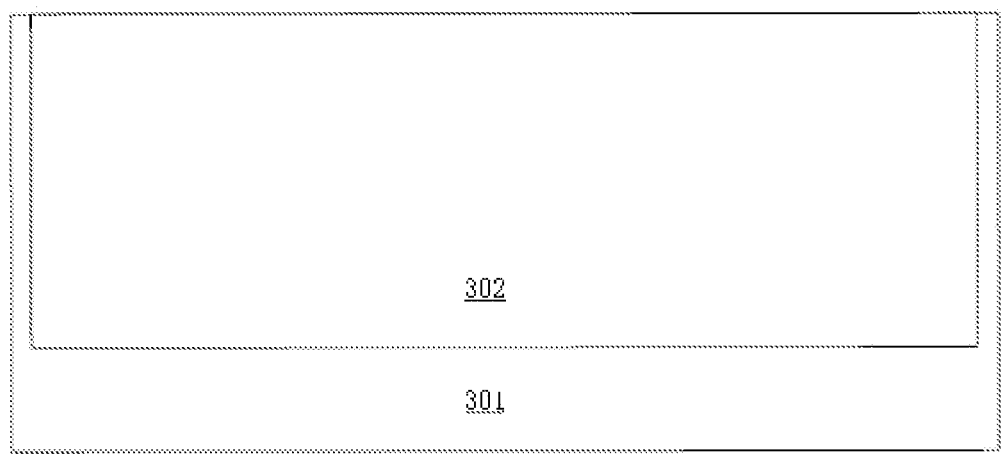
FIGS. 4a-4e show a sectional schematic diagram of each stage of a method for manufacturing the transistor structure for electrostatic protection according to the first embodiment of the present disclosure.

As shown in FIG. 4a, firstly, a substrate 301 and a doped region 302 located in an upper portion of the substrate 301 are formed. A small number of ions are injected into the semiconductor substrate 301, and a well is pushed at a high temperature to form a shallowly doped N-type region, that is, the doped region 302. This step can be completed by using a conventional process. The substrate 301 is, for example, a silicon substrate.

Figure 4B:
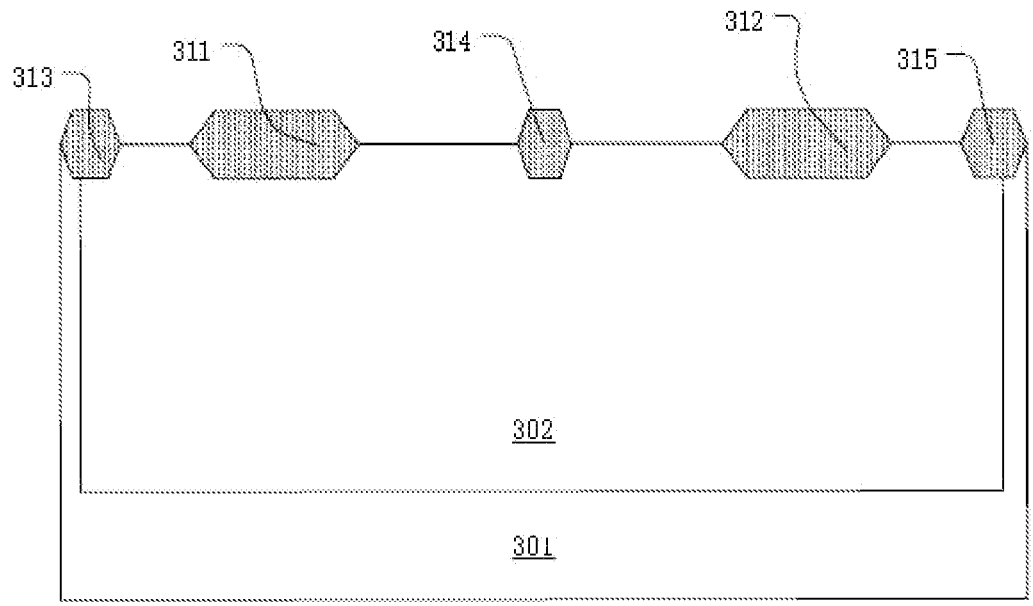

Further, as shown in FIG. 4b, a plurality of field oxide layers are formed on a surface of the substrate 301. Field oxide isolation is performed on the surface of the substrate 301, that is, the plurality of field oxide layers spaced from one another are formed, and as shown in FIG. 4b, the field oxide layers 311 to 315 are formed. The field oxide layers can be formed by a conventional process, which is, for example, a process firstly deposits an oxide layer on the surface of the substrate 301, then deposits a hard mask, performs etching by using the mask, and finally performs field oxide growth under a high temperature, and then removes the hard mask. Specific process steps are not limited in detail. After the step of forming the field oxide layers is completed, that is, the structure as shown in the FIG. 4b is formed, the third field oxide layer 313, the first field oxide layer 311, the fourth field oxide layer 314, the second field oxide layer 312 and the fifth field oxide layer 315 are formed in sequence from left to right, wherein the first field oxide layer 311 and the second field oxide layer 312 have longer lengths.

Figure 4C:
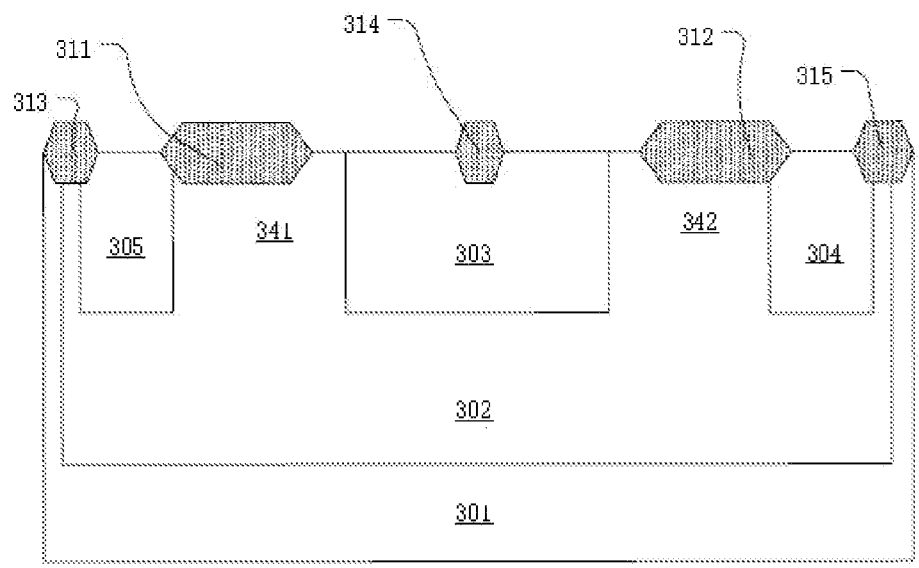

Then, as shown in FIG. 4c, a first N-type well region 305, a P-type well region 303 and a second N-type well region 304 which are located in an upper portion of the doped region 302 and spaced in sequence are formed. Well region injection is performed from the surface of the substrate 301 to form the first N-type well region 305, the P-type well region 303 and the second N-type well region 304 which are spaced form one another in sequence in the doped region, wherein the P-type well region 303 is wider. The first N-type well region 305 is located between the third field oxide layer 313 and the first field oxide layer 311, the P-type well region 303 is located between the first field oxide layer 311 and the second field oxide layer 312, and the second N-type well region 304 is located between the second field oxide layer 312 and the fifth field oxide layer 315.

Figure 4D:
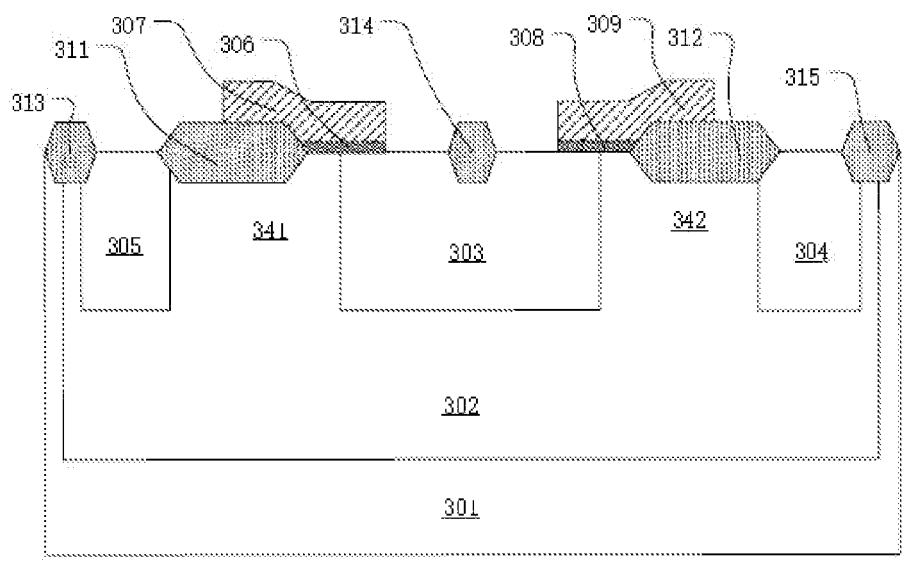

Then, as shown in FIG. 4d, a first polycrystalline silicon layer 307 and a second polycrystalline silicon layer 309 located on the surface of the substrate 301 are formed. The first polycrystalline silicon layer 307 is manufactured above the first field oxide layer 311, wherein the first polycrystalline silicon layer 307 covers part of the first field oxide layer 311 and part of the P-type well region 303, and further a first gate oxide layer 306 is formed between the P-type well region 303 and the first polycrystalline silicon layer 307. Processes for forming the first gate oxide layer 306 and the first polycrystalline silicon layer 307 are conventional processes, and are not limited in detail herein. The second polycrystalline silicon layer 309 is manufactured above the second field oxide layer 312, wherein the second polycrystalline silicon layer 309 covers part of the second field oxide layer 312 and part of the P-type well region 303, and further a second gate oxide layer 308 is formed between the P-type well region 303 and the second polycrystalline silicon layer 309. Processes for forming the second gate oxide layer 308 and the second polycrystalline silicon layer 309 are conventional processes, and are not limited in detail herein. The first polycrystalline silicon layer 307 and the second polycrystalline silicon layer 309, for example, are formed by deposition through a chemical vapor deposition method.

Figure 4E:
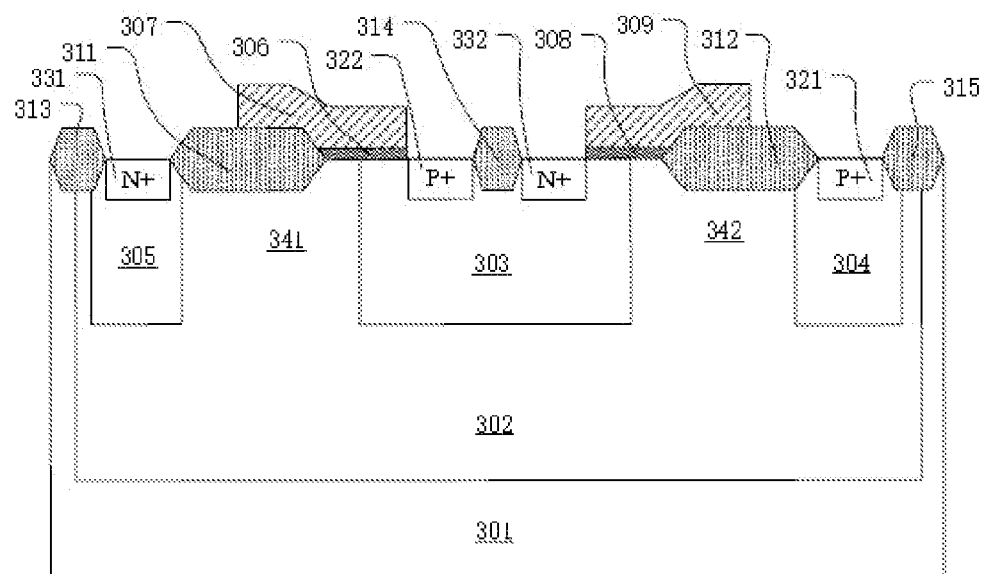

Further, as shown in FIG. 4e, a first N+ region 331 and a first P+ region 321 which are respectively located in the first N-type well region 305 and the second N-type well region 304, are formed, and a second N+ region 332 and a second P+ region 322 located in the P-type well region 303 are formed. P+ or N+ injection is performed in the first N-type well region 305, the P-type well region 303 and the second N-type well region 304 to form the plurality of P+ regions or N+ regions.

Finally, as shown in FIG. 3, contact holes are formed for leading out a cathode and an anode, thus metal wire connection can be completed. As description to FIG. 3, a first anode and a second anode of the transistor structure are led out from the first N+ region 331 and the first P+ region 321, respectively; and the second N+ region 332, the second P+ region 322, the first polycrystalline silicon layer 307 and the second polycrystalline silicon layer 309 are connected together to a connection node, which serves as a cathode of a semiconductor structure. Therefore, preparation of the transistor structure shown in FIG. 3 is completed. The transistor structure improves the IGBT structure, achieves the electrostatic protection capability under an assembly charging model of a device, and reserves a reverse characteristic of an original LDMOS structure. Meanwhile, the manufacturing process is compatible with conventional manufacturing processes for an IGBT structure or the like, and is easy to be implemented. Compared with a traditional transistor structure, the transistor structure according to the embodiments of the present disclosure has a reduced structure size and good performance.

Figure 5:
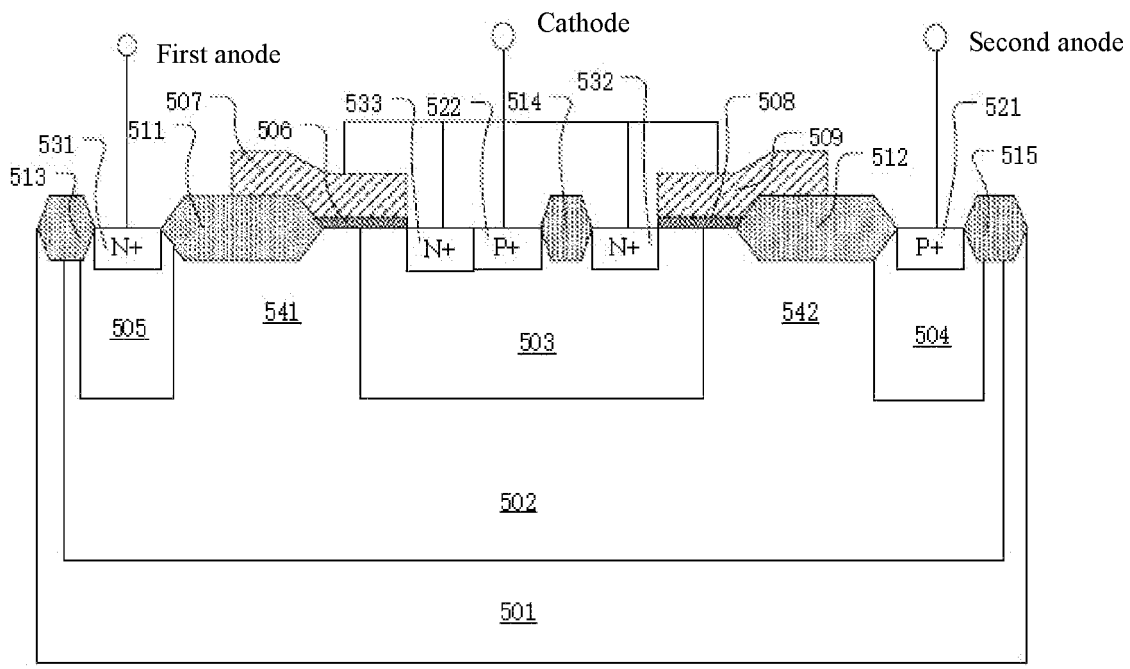
FIG. 5 shows a sectional schematic diagram of a transistor structure for electrostatic protection according to a second embodiment of the present disclosure.

FIG. 5 shows a sectional schematic diagram of a transistor structure for electrostatic protection according to a second embodiment of the present disclosure.

FIG. 5 shows the transistor structure of the second embodiment, and compared with the transistor structure of the first embodiment, the transistor structure of this embodiment adds a third N+ region 533 in the P-type well region 503.

As shown in FIG. 5, the transistor structure comprises a substrate 501, a doped region 502 located in an upper portion of the substrate 501, and a P-type well region 503, a first N-type well region 505 and a second N-type well region 504 located in an upper portion of the doped region 502. The doped region 502 is an N-type shallowly doped region. The first N-type well region 505, the P-type well region 503 and the second N-type well region 504 are spaced in sequence, a first drift region 541 is provided between the first N-type well region 505 and the P-type well region 503, a second drift region 542 is provided between the second N-type well region 504 and the P-type well region 503, and the first drift region 541 and the second drift region 542 have equal lengths.

Further, a first N+ region 531 and a first P+ region 521 are formed in the first N-type well region 505 and the second N-type well region 504, respectively, a third N+ region 533, a second P+ region 522 and a second N+ region 532 are formed in the P-type well region 503, wherein the third N+ region 533 and the second P+ region 522 are adjacent to each other and make contact with each other without an oxide layer for isolation in between.

Further, a first anode and a second anode of the transistor structure are led out from the first N+ region 531 and the first P+ region 521, respectively; and the second N+ region 532, the second P+ region 522, the third N+ region 533, the first polycrystalline silicon layer 507 and the second polycrystalline silicon layer 509 are connected together at a connection node, which serves as a cathode of a semiconductor structure.

As shown in FIG. 5, when the transistor structure works under forward operation, that is, when an anode voltage is greater than a cathode voltage, similar to the description of FIG. 3, in the embodiment, a current channel which may be formed between the first anode and the cathode have to pass through the first N+ region 531, the first N-type well region 505, the doped region 502, the P-type well region 503 and the third N+ region 333, that is, passing an N-P-N structure equivalently; and the current channel which may be formed between the second anode and the cathode have to pass through the first P+ region 522, the second N-type well region 504, the doped region 502, the P-type well region 503 and the second N+ region 532, that is, passing through a P-N-P-N structure equivalently. Therefore, the current channel between the first anode/the second anode and the cathode may pass through an N-P junction which is located between the doped region 502 and the P-type well region 503 and needs to be broken down, but in this embodiment, the third N+ region 533 is connected to the second P+ region 522, such that in the P-type well region 503, an electric field below the third N+ region 533 is higher, an N-P-N path is not prone to be formed, and the first drift region 541 and the second drift region 542 have equal lengths, such that the current channel between the second anode and the cathode is conducted firstly, a current channel is formed between the second anode and the cathode under forward operation, which is consistent with the IGBT structure described in FIG. 2, accordingly the base region stretching effect may be effectively suppressed, and the electrostatic protection capability is good.

Under reverse operation, the transistor structure is described the same as the embodiment of FIG. 3, which will not be described in detail repeatedly, such that under reverse operation, a current path is formed between the cathode and the first anode, and accordingly, the transistor structure has good reverser characteristic and strong electrostatic protection capability.

Therefore, it may be approximately deemed that a left half part of the transistor structure is the LDMOS structure, and a right half part thereof is the IGBT structure. The two drift regions have equal lengths, but in the P-type well region 503, the third N+ region 533 is connected to the second P+ region 522, which changes an electric field in the P-type well region 503, such that when under forward operation, the right IGBT structure begins to operate earlier than the left LDMOS structure, and under reverse operation, the right IGBT structure may rely on the left LDMOS structure to form a diode path. In this way, a novel transistor structure has both the electrostatic protection capability and the good reverse characteristic. The base region stretching effect is suppressed and the problem of the poor reverse characteristic of the IGBT structure is further solved. A process for manufacturing the transistor structure is compatible with an existing process, and easy to operate and implement. In addition, compared with a traditional combination of the LDMOS structure and the IGBT structure, the transistor structure of the embodiment omits the manufacturing of the drain end structure of the LDMOS, resulting in that the transistor structure is reduced in size to a great degree and is more miniaturized, an occupation area of a transistor is reduced, the manufacturing process cost is saved on and batch production is more convenient.

In one embodiment, when a field oxide layer is further arranged between the third N+ region 533 and the second P+ region 522, the transistor structure is a traditional transistor structure combining the LDMOS structure and the IGBT structure, and the first drift region 541 is slightly longer than the second drift region 542, then, under forward operation, due to a difference in lengths of the drift regions, the current channel between the second anode and the cathode may be conducted firstly, similar to this embodiment, a current channel is formed between the second anode and the cathode, but the drift region of the right semiconductor structure is short, therefore a breakdown voltage is reduced, and an application range of the whole device is narrowed. In the embodiment of the present disclosure, although a current channel is also formed between the second anode and the cathode firstly, the drift regions have the equal lengths, such that the breakdown voltage is not reduced, and compared with the embodiment mentioned above, the breakdown voltage is guaranteed, and a forward conductivity characteristic is good. In addition, compared with the traditional manufacturing process, the embodiment removes the oxide layer between the third N+ region 533 and the second P+ region 522, thereby reducing the size of the transistor structure, and making manufacturing easier.

FIGS. 6a-6e show a sectional schematic diagram of each stage of a method for manufacturing the transistor structure for electrostatic protection according to the second embodiment of the present disclosure. The manufacturing process of the transistor structure of the embodiment is similar to the process steps shown in FIGS. 4a-4e, and is briefly described with reference to the process of FIGS. 4a-4e.

Figure 6A:
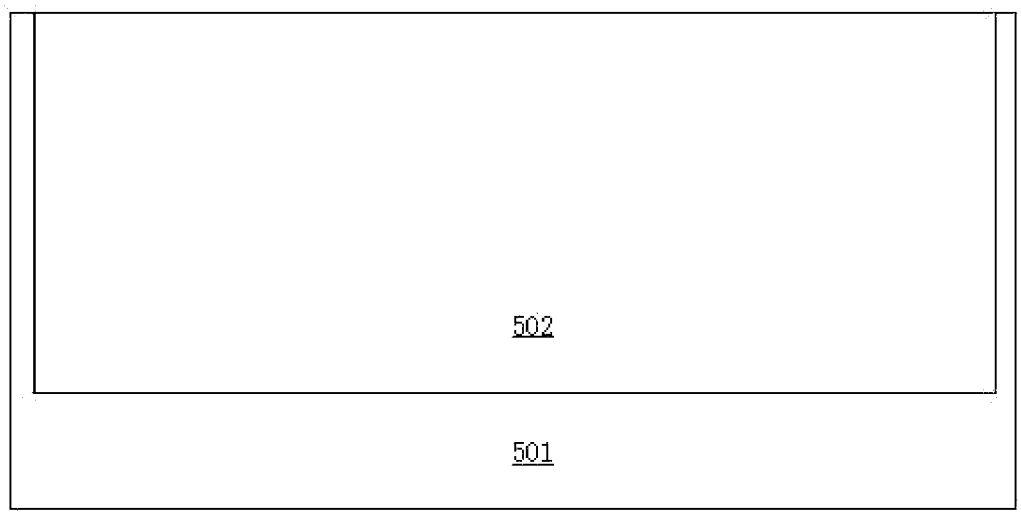
FIGS. 6a-6e show a sectional schematic diagram of each stage of a method for manufacturing the transistor structure for electrostatic protection according to the second embodiment of the present disclosure.

As shown in FIG. 6a, firstly, a substrate 501 and a doped region 502 located in an upper portion of the substrate 501 are formed. A small number of ions are injected into the semiconductor substrate 501, and a well is pushed at a high temperature to form a shallowly doped N-type region, that is, the doped region 502. The substrate 501, for example, is a silicon substrate.

Figure 6B:
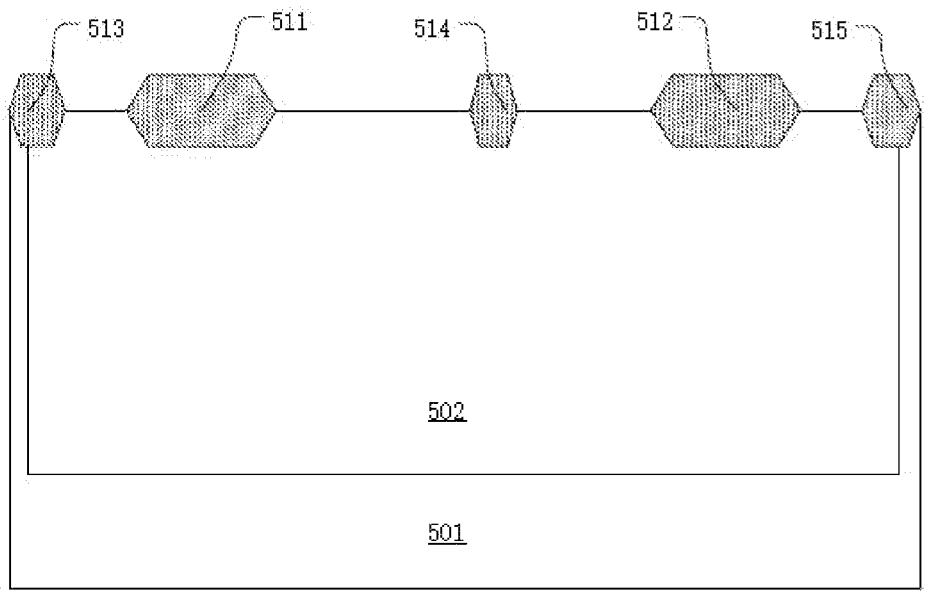

Further, as shown in FIG. 6b, a plurality of field oxide layers are formed on a surface of the substrate 501. Field oxide isolation is performed on the surface of the substrate 501, that is, the plurality of field oxide layers spaced from one another are formed, and as shown in FIG. 6b, the field oxide layers 511 to 515 are formed.

Figure 6C:
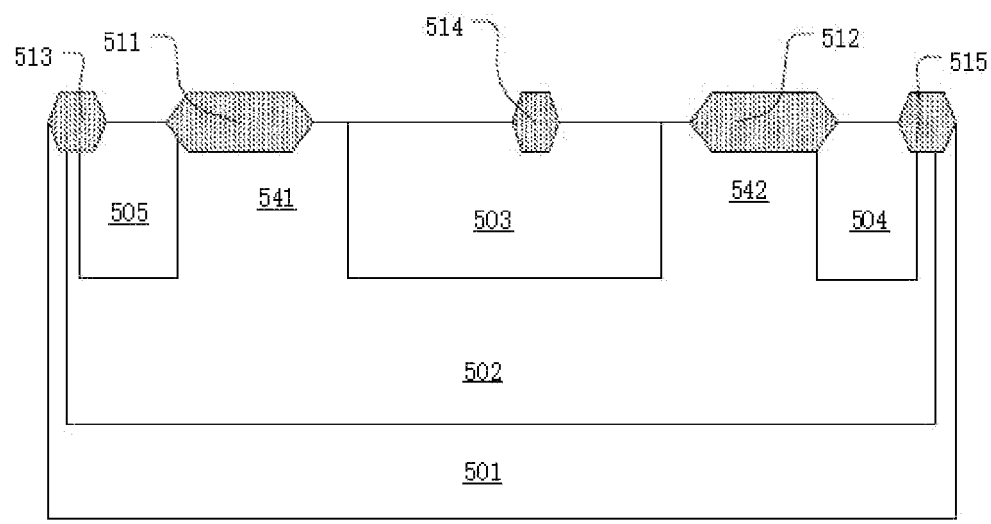

Then, as shown in FIG. 6c, a first N-type well region 505, a P-type well region 503 and a second N-type well region 504 which are located in an upper portion of the doped region 502 and spaced in sequence are formed. Well injection is performed from the surface of the substrate 501 to form the first N-type well region 505, the P-type well region 503 and the second N-type well region 504 which are spaced form one another in sequence in the doped region, wherein the P-type well region 503 is wider.

Figure 6D:
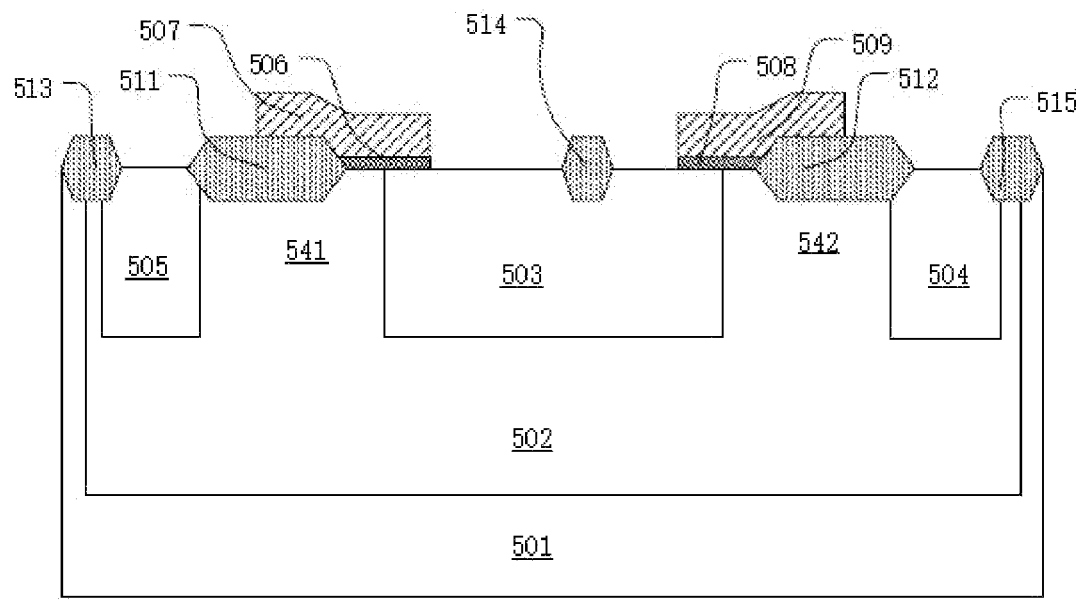

Then, as shown in FIG. 6d, a first polycrystalline silicon layer 507 and a second polycrystalline silicon layer 509 located on the surface of the substrate 501 are formed. The first polycrystalline silicon layer 507 is manufactured above the first field oxide layer 511, wherein the first polycrystalline silicon layer 507 covers part of the first field oxide layer 511 and part of the P-type well region 503, and further a first gate oxide layer 506 is formed between the P-type well region 503 and the first polycrystalline silicon layer 507. Processes for forming the first gate oxide layer 506 and the first polycrystalline silicon layer 507 are conventional processes, and are not limited in detail herein. The second polycrystalline silicon layer 509 is manufactured above the second field oxide layer 512, wherein the second polycrystalline silicon layer 509 covers part of the second field oxide layer 512 and part of the P-type well region 503, and further a second gate oxide layer 508 is formed between the P-type well region 503 and the second polycrystalline silicon layer 509. Processes for forming the second gate oxide layer 508 and the second polycrystalline silicon layer 509 are conventional processes, and are not limited in detail herein. The first polycrystalline silicon layer 507 and the second polycrystalline silicon layer 509, for example, are formed by deposition through a chemical vapor deposition method.

Figure 6E:
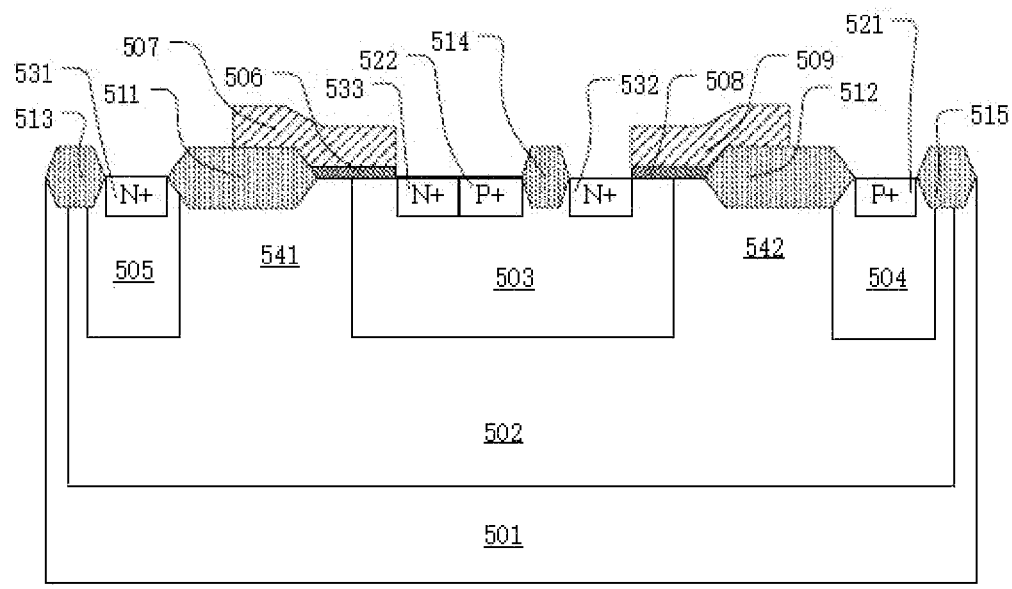

Further, as shown in FIG. 6e, a first N+ region 531 and a first P+ region 521 which are located in the first N-type well region 505 and the second N-type well region 504, respectively, are formed, and a third N+ region 533, a second P+ region 522 and a second N+ region 532 in the P-type well region 503 are formed. P+ or N+ injection is performed in the first N-type well region 505, the P-type well region 503 and the second N-type well region 504 to form the plurality of P+ regions or N+ regions.

Finally, as shown in FIG. 5, contact holes are formed to leading out a cathode and an anode, thus metal wire connection can be completed. As description to FIG. 5, a first anode and a second anode of the transistor structure are led out from the first N+ region 531 and the first P+ region 521, respectively; and the second N+ region 532, the second P+ region 522, the third N+ region 533, the first polycrystalline silicon layer 507 and the second polycrystalline silicon layer 509 are connected together to a connection node, which serves as a cathode of a semiconductor structure. Therefore, preparation of the transistor structure shown in FIG. 5 is completed.

Therefore, the two embodiments of the present disclosure both improve the drain end structure of the traditional LDMOS structure, and omit/reduce the manufacturing steps of an N+ region or an oxide layer, so as to change a conduction path of the transistor structure combining the LDMOS device and the IGBT device, the novel transistor structure according to the embodiments of the present disclosure may select a proper forward or reverse conduction path, and the electrostatic protection capability is improved. The size is greatly reduced, and the process cost is saved.

In conclusion, in the transistor structure for electrostatic protection and the method for manufacturing the same according to the embodiments of the present disclosure, the first N-type well region, the P-type well region and the second N-type well region which are spaced in sequence are formed in the upper portion of the substrate, the first N+ region and the first P+ region are formed in the first N-type well region and the second N-type well region, respectively, the second P+ region close to the first N+ region and the second N+ region close to the first P+ region are formed in the P-type well region, so as to change a PN junction structure at each position of the transistor structure, such that when the transistor works, a conductivity feature of each position is changed, then the current path of the transistor structure under forward operation and reverse operation can be changed, the transistor structure may effectively suppress the base region stretching effect under forward operation and may provide better electrostatic protection capability under reverse operation, thereby improving the electrostatic protection capability of the entire transistor structure, and the process is easy to implement and operate. In addition, compared with a traditional preparation process, the transistor structure of the present disclosure reduces one oxide layer, such that the transistor structure is smaller in size and simpler in process.

Further, under forward operation, the current path between the second anode and the cathode is easier to be conducted to form the current channel for fully suppressing the base region stretching effect; and under reverse operation, the current channel is formed between the cathode and the first anode to perform better electrostatic protection capability.

Figure 7:
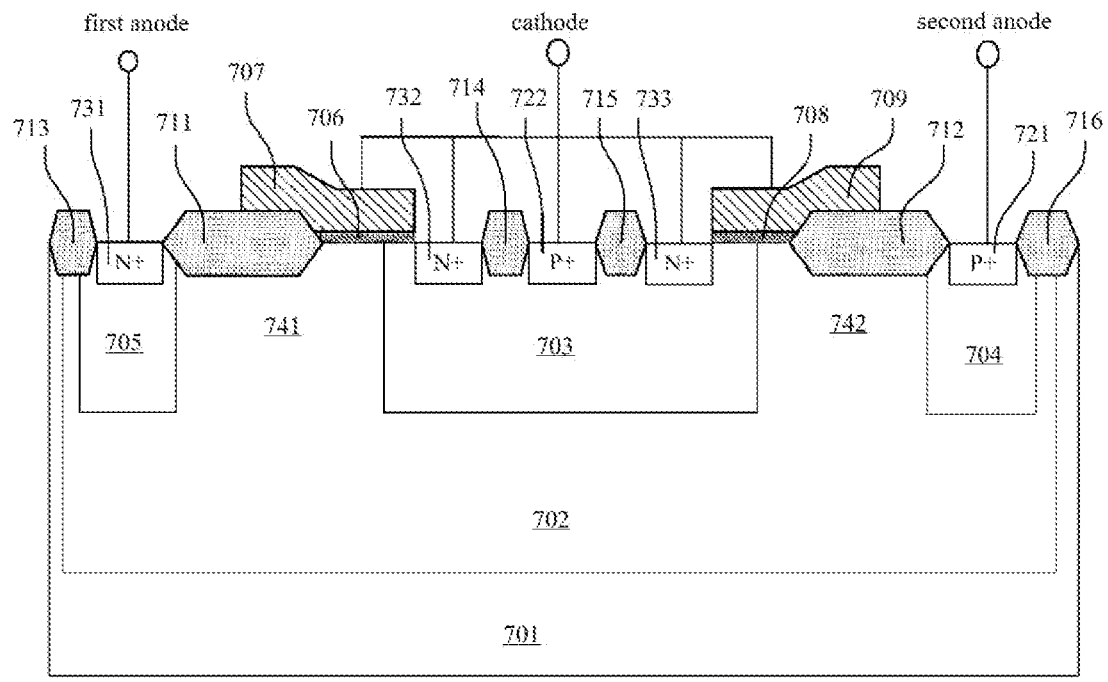
FIG. 7 shows a sectional schematic diagram of a transistor structure for electrostatic protection according to a third embodiment of the present disclosure.

FIG. 7 shows a sectional schematic diagram of a transistor structure for electrostatic protection according to a third embodiment of the present disclosure.

As shown in FIG. 7, the transistor structure comprises a substrate 701, a doped region 702 located in an upper portion of the substrate 701, and a P-type well region 703, a first N-type well region 705 and a second N-type well region 704 located in an upper portion of the doped region 702. The doped region 702 is an N-type shallowly doped region. The first N-type well region 705, the P-type well region 703 and the second N-type well region 704 are spaced in sequence, a first drift region 741 is provided between the first N-type well region 705 and the P-type well region 703, a second drift region 742 is provided between the second N-type well region 704 and the P-type well region 703, and the first drift region 741 has a length slightly larger than a length of the second drift region 742 have equal lengths.

Further, a first N+ region 731 and a first P+ region 721 are formed in the first N-type well region 705 and the second N-type well region 704, respectively, and a second P+ region 722, a second N+ region 732 and a third N+ region 733 are formed in the P-type well region 703, among these regions, each two adjacent ones are separated by an oxide layer. Specifically, a first field oxide layer 711 is formed on a surface, between the first N+ region 731 and the second N+ region 732, of the substrate 701, a second field oxide layer 712 is formed on a surface, between the third N+ region 733 and the first P+ region 721, of the substrate 701, additionally, a third field oxide layer 713 is formed on the other side of the first N+ region 731, a fourth field oxide layer 714 is formed between the second N+ region 732 and the second P+ region 722, a fifth field oxide layer 715 is formed between the second P+ region 722 and the third N+ region 733, a sixth field oxide layer 716 is formed on the other side of the first P+ region 721, a growth of each field oxide layer can be achieved by a conventional process.

In addition, a first polycrystalline silicon layer 707 is further formed above the first field oxide layer 711, and a first gate oxide layer 706 is formed between the first polycrystalline silicon layer 707 and the first field oxide layer 711, which is not described in detail herein. Similarly, a second polycrystalline silicon layer 709 is further formed above the second field oxide layer 712, and a second gate oxide layer 708 is formed between the second polycrystalline silicon layer 709 and the second field oxide layer 712. The first polycrystalline silicon layer 707 and the second polycrystalline silicon layer 709 both cover part of a surface of the P-type well region 703.

Further, a first anode and a second anode of the transistor structure are led out from the first N+ region 731 and the first P+ region 721, respectively; and the second N+ region 732, the second P+ region 722, the third N+ region 733, the first polycrystalline silicon layer 707 and the second polycrystalline silicon layer 709 are connected at a connection node, which serves as a cathode of the semiconductor structure.

As shown in FIG. 7, when the transistor structure is under forward operation, that is, when an anode voltage is greater than a cathode voltage, a current channel which may be formed between the first anode and the cathode have to pass through the first N+ region 731, the first N-type well region 705, the doped region 702, the P-type well region 703 and the second N+ region 732, that is, passing through an N-P-N structure equivalently, and a current channel which may be formed between the second anode and the cathode have to pass through the first P+ region 722, the second N-type well region 704, the doped region 702, the P-type well region 703 and the third N+ region 733, that is, passing through a P-N-P-N structure equivalently. Therefore, the current channel between the first anode/second anode and the cathode may pass through an N-P junction which needs to be broken down, however, in the embodiment, the length of the first drift region 741 is slightly larger than the length of the second drift region 742, therefore the current channel between the second anode and the cathode is firstly conducted, thus, under forward operation, the current channel between the second anode and cathode is formed, which is consistent with the IGBT structure described in FIG. 2, the base region stretching effect may be effectively suppressed, and the electrostatic protection capability is good.

When the transistor structure works under reverse operation, that is, when the cathode voltage is greater than the anode voltage, as described in FIG. 2, a path between the cathode and the second anode needs to pass through a high-voltage avalanche breakdown, a P-N diode path formed between the cathode and the first anode needs to pass through the second P+ region 722, the P-type well region 703, the doped region 702, the first N-type well region 705 and the first N+ region 731, due to a forward conductivity characteristic of a diode, the P-N diode path is more easily conducted than the path with the avalanche breakdown, such that under reverse operation, a current path is formed between the cathode and the first anode, and accordingly, the transistor structure has good reverse characteristic and strong electrostatic protection capability.

In one embodiment, the transistor structure comprises a first semiconductor structure and a second semiconductor structure, wherein the first semiconductor structure is a lateral diffused MOS (LDMOS) structure, that is, a lateral double-diffused MOS transistor, the second semiconductor is the IGBT structure. Specifically, the first semiconductor structure comprises the substrate 701, the doped region 702, the first N-type well region 705, the P-type well region 703, the first N+ region 731, the second N+ region 732, the first polycrystalline silicon layer 707 and the first field oxide layer 711; and the second semiconductor structure comprises the substrate 701, the doped region 702, the second N-type well region 704, the P-type well region 703, the first P+ region 721, the second P+ region 722, the third N+ region 733, the second polycrystalline silicon layer 709 and the second field oxide layer 712.

Therefore, it may be approximately deemed that a left half part of the transistor structure is the LDMOS structure and a right half part thereof is the IGBT structure, and the drift region of the IGBT structure is smaller than the drift region of the LDMOS structure. Thus, when the device works under forward operation, the right IGBT structure begins to operate earlier than the left LDMOS structure, and when the device works under reverse operation, the right IGBT structure may rely on the left LDMOS structure to form a diode path. In this way, a novel transistor structure has both the electrostatic protection capability and the good reverse characteristic, suppresses the base region stretching effect and further solves the problem of the poor reverse characteristic of the IGBT structure. A process for manufacturing the transistor structure is compatible with an existing process, and easy to operate and implement.

The semiconductor device structure shown in FIG. 7 is manufactured by means of the process steps shown in FIGS. 8a-8e to further improve the electrostatic protection capability of the insulated gate bipolar transistor, and a manufacturing method is described below.

FIGS. 8a-8e show a sectional schematic diagram of each stage of a method for manufacturing the transistor structure for electrostatic protection according to the embodiment of the present disclosure. A manufacturing flow of the transistor structure of the embodiment of the present disclosure is described below in conjunction with FIGS. 8a-8e.

Figure 8A:
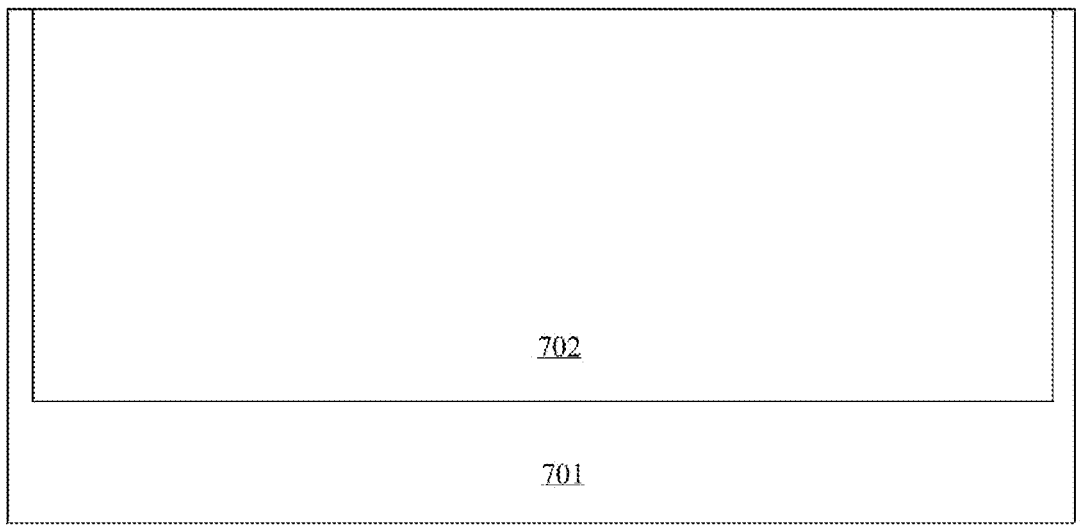
FIGS. 8a-8e show a sectional schematic diagram of each stage of a method for manufacturing the transistor structure for electrostatic protection according to the third embodiment of the present disclosure.

As shown in FIG. 8a, firstly, a substrate 701 and a doped region 702 located in an upper portion of the substrate 701 are formed. A small number of ions are injected into the semiconductor substrate 701, and a well is pushed at a high temperature to form a shallowly doped N-type region, that is, the doped region 702. This step can be completed by using a conventional process. The substrate 701 is, for example, a silicon substrate.

Figure 8B:
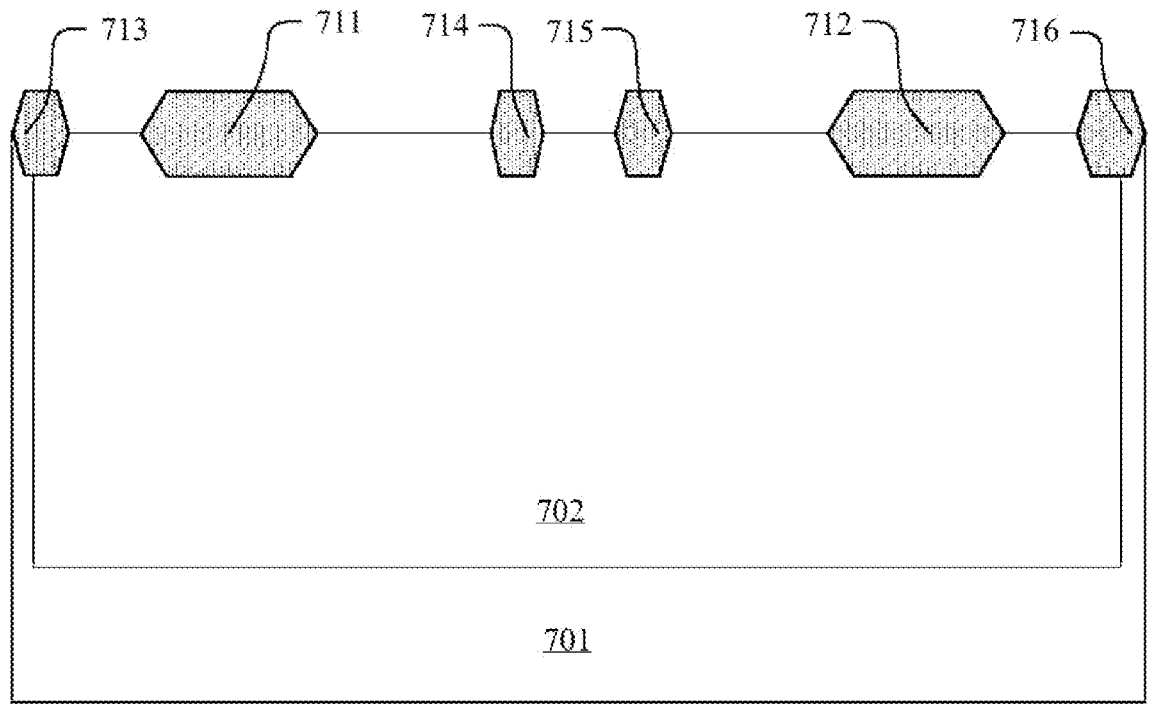

Further, as shown in FIG. 8b, a plurality of field oxide layers are formed on a surface of the substrate 701. Field oxide isolation is performed on the surface of the substrate 701, that is, the plurality of field oxide layers spaced from one another are formed, and as shown in FIG. 8b, the field oxide layers 711 to 716 are formed. The field oxide layers can be formed by a conventional process, which is, for example, a process firstly deposits an oxide layer on the surface of the substrate 701, then deposits a hard mask, performs etching by using the mask, and finally performs field oxide growth under a high temperature, and then removes the hard mask. Specific process steps are not limited in detail. After the step of forming the field oxide layers is completed, that is, the structure as shown in the FIG. 8b is formed, the third field oxide layer 713, the first field oxide layer 711, the fourth field oxide layer 714, the fifth field oxide layer 715, the second field oxide layer 712 and the sixth field oxide layer 716 are formed in sequence from left to right, wherein the first field oxide layer 711 and the second field oxide layer 712 have longer lengths.

Figure 8C:
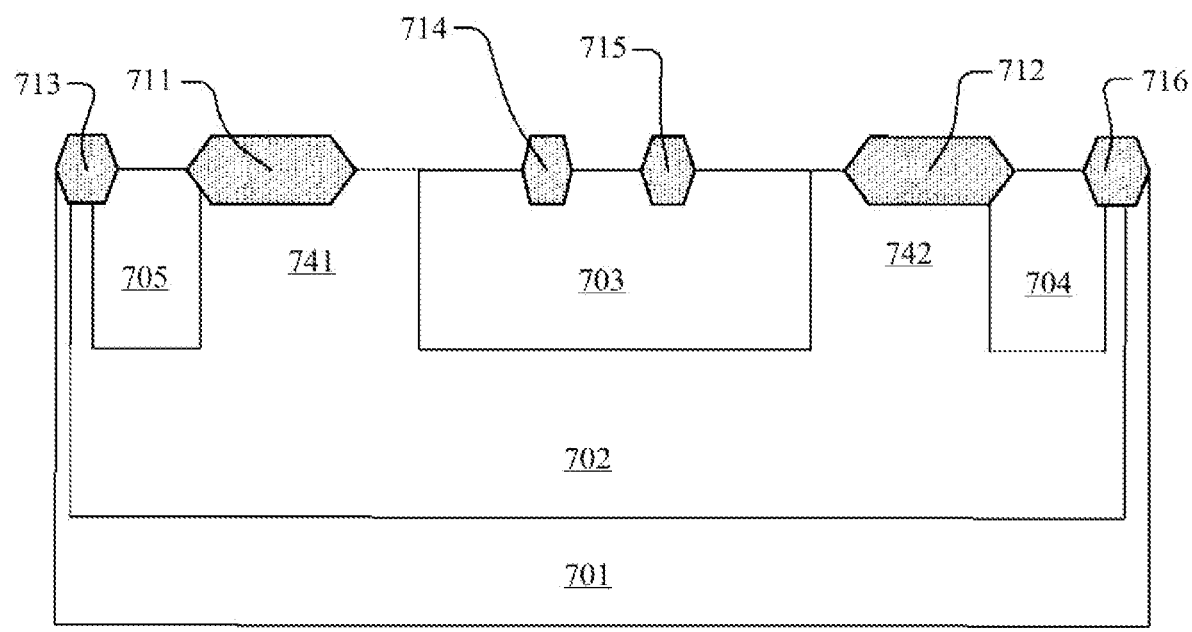

Then, as shown in FIG. 8c, a first N-type well region 705, a P-type well region 703 and a second N-type well region 704 which are located in an upper portion of the doped region 702 and spaced in sequence are formed. Well region injection is performed from the surface of the substrate 701 to form the first N-type well region 705, the P-type well region 703 and the second N-type well region 704 which are spaced form one another in sequence in the doped region, wherein the P-type well region 703 is wider. The first N-type well region 705 is located between the third field oxide layer 713 and the first field oxide layer 711, the P-type well region 703 is located between the first field oxide layer 711 and the second field oxide layer 712, and the second N-type well region 704 is located between the second field oxide layer 712 and the sixth field oxide layer 716.

Figure 8D:
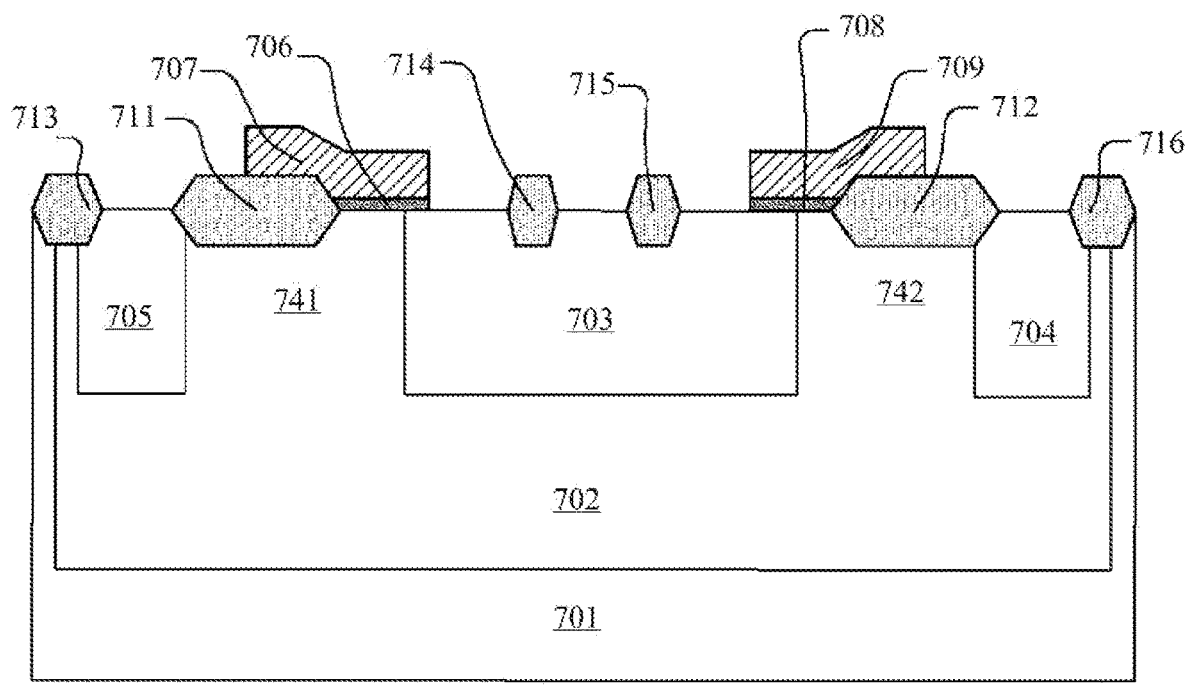

Then, as shown in FIG. 8d, a first polycrystalline silicon layer 707 and a second polycrystalline silicon layer 709 located on the surface of the substrate 701 are formed. The first polycrystalline silicon layer 707 is manufactured above the first field oxide layer 711, wherein the first polycrystalline silicon layer 707 covers part of the first field oxide layer 711 and part of the P-type well region 703, and further a first gate oxide layer 706 is formed between the P-type well region 703 and the first polycrystalline silicon layer 707. Processes for forming the first gate oxide layer 706 and the first polycrystalline silicon layer 707 are conventional processes, and are not limited in detail herein. The second polycrystalline silicon layer 709 is manufactured above the second field oxide layer 712, wherein the second polycrystalline silicon layer 709 covers part of the second field oxide layer 712 and part of the P-type well region 703, and further a second gate oxide layer 708 is formed between the P-type well region 703 and the second polycrystalline silicon layer 709. Processes for forming the second gate oxide layer 708 and the second polycrystalline silicon layer 709 are conventional processes, and are not limited in detail herein. The first polycrystalline silicon layer 707 and the second polycrystalline silicon layer 709, for example, are formed by deposition through a chemical vapor deposition method.

Figure 8E:
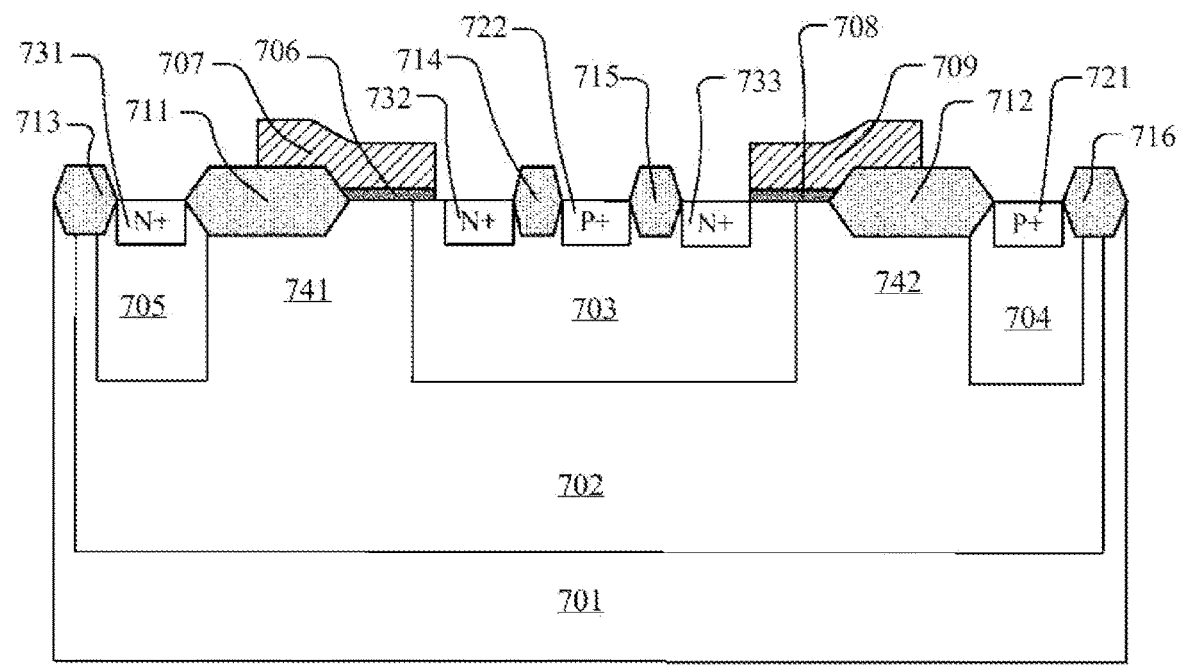

Further, as shown in FIG. 8e, the first N+ region 731 and the first P+ region 721 which are respectively located in the first N-type well region 705 and the second N-type well region 704, are formed, and the second N+ region 732, the second P+ region 722 and the third N+ region 733 located in the P-type well region 703 are formed. P+ or N+ injection is performed in the first N-type well region 705, the P-type well region 703 and the second N-type well region 704 to form the plurality of P+ regions or N+ regions.

Finally, as shown in FIG. 7, contact holes are formed for leading out a cathode and an anode, thus metal wire connection can be completed. As description to FIG. 7, a first anode and a second anode of the transistor structure are led out from the first N+ region 731 and the first P+ region 721, respectively; and the second N+ region 732, the second P+ region 722, the third N+ region 733, the first polycrystalline silicon layer 707 and the second polycrystalline silicon layer 709 are connected together to a connection node, which serves as a cathode of a semiconductor structure. Therefore, preparation of the transistor structure shown in FIG. 7 is completed. The transistor structure improves the IGBT structure, achieves the electrostatic protection capability under an assembly charging model of a device, and reserves a reverse characteristic of an original LDMOS structure. Meanwhile, the manufacturing process is compatible with conventional manufacturing processes for an IGBT structure or the like, and is easy to be implemented.

In the transistor structure for electrostatic protection and the method for manufacturing the same according to the embodiment of the present disclosure, the first N-type well region, the P-type well region and the second N-type well region which are spaced in sequence are formed in the upper portion of the substrate, and the first drift region located between the first N-type well region and the P-type well region has a length larger than the length of the second drift region located between the second N-type well region and the P-type well region, such that the current path of the transistor structure under forward operation and reverse operation can be changed, the transistor structure may effectively suppress the base region stretching effect under forward operation and may provide better electrostatic protection capability under reverse operation, thereby improving the electrostatic protection capability of the entire transistor structure, and the process is easy to implement and operate.

Further, the first anode and the second anode are led out from the first N+ region and the first P+ region, respectively, the cathode is connected to the second N+ region, the second P+ region the third N+ region the first polycrystalline silicon layer and the second polycrystalline silicon layer, thus, under forward operation, the first drift region has a length larger than the length of the second drift region, the current path between the second anode and the cathode is conducted to fully suppressing the base region stretching effect; and under reverse operation, the current channel between the cathode and the first anode is conducted to perform better electrostatic protection capability.

The embodiments in accordance with the present disclosure, as described above, do not fully describe all the details, and the present disclosure is not limited thereto. Obviously, many modifications and changes may be made in light of the above description. These embodiments have been chosen and described in detail by the specification to better explain the principles and practical applications of the present disclosure, such that those skilled in the art to which the disclosure pertains can make good use of the present disclosure and modified use based on the present disclosure. The present invention is limited only by the claims and the scope and equivalents thereof.

What is claimed is:

1. A transistor structure for electrostatic protection, comprising:
   a substrate and a doped region formed in an upper portion of the substrate;
   a plurality of field oxide layers formed on a surface of the substrate;
   a first N-type well region, a P-type well region and a second N-type well region formed in an upper portion of the doped region and spaced in sequence;

a first polycrystalline silicon layer and a second polycrystalline silicon layer formed on the surface of the substrate and covering part of the P-type well region;

a first N+ region and a first P+ region formed in the first N-type well region and the second N-type well region, respectively; and a second N+ region and a second P+ region formed in the P-type well region, wherein the second P+ region in the P-type well region is close to the first N+ region, and the second N+ region in the P-type well region is close to the first P+ region, wherein the first N+ region is formed without being in direct contact with any region of P type, and the first P+ region is formed without being in direct contact with any N+ region.

2. The transistor structure for electrostatic protection according to claim 1, wherein a first anode and a second anode of the transistor structure are led out from the first N+ region and the first P+ region, respectively; and the second N+ region, the second P+ region, the first polycrystalline silicon layer and the second polycrystalline silicon layer are connected together at a connection node, which serves as a cathode of a semiconductor structure.

3. The transistor structure for electrostatic protection according to claim 2, further comprising:

a third N+ region formed in the P-type well region, wherein the third N+ region is connected to the cathode and close to the first N+ region.

4. The transistor structure for electrostatic protection according to claim 3, wherein the third N+ region is in direct contact with the second P+ region.

5. The transistor structure for electrostatic protection according to claim 3, wherein the third N+ region is separate from the second P+ region, and a first drift region, located between the first N-type well region and the P-type well region, has a larger length than a length of a second drift region located between the second N-type well region and the P-type well region.

6. The transistor structure for electrostatic protection according to claim 1, wherein the first polycrystalline silicon layer is located above a first field oxide layer between the P-type well region and the first N-type well region; and the second polycrystalline silicon layer is located above a second field oxide layer between the P-type well region and the second N-type well region.

7. The transistor structure for electrostatic protection according to claim 2, wherein when the transistor structure works under forward operation, a conductive channel is formed between the second anode and the cathode; and when the transistor structure works under reverse operation, a conductive channel is formed between the cathode and the first anode.

8. The transistor structure for electrostatic protection according to claim 1, wherein the doped region is a shallowly doped N-type region.

9. The transistor structure for electrostatic protection according to claim 1, wherein a first drift region, located between the first N-type well region and the P-type well region, has a length equal to or larger than a length of a second drift region, located between the second N-type well region and the P-type well region.

10. The transistor structure for electrostatic protection according to claim 6, wherein the transistor structure comprises a first semiconductor structure and a second semiconductor structure, wherein the first semiconductor structure comprises the substrate, the doped region, the first N-type well region, the P-type well region, the first N+ region, the first polycrystalline silicon layer and the first field oxide layer; and the second semiconductor structure comprises the substrate, the doped region, the second N-type well region, the P-type well region, the first P+ region, the second P+ region, the second N+ region, the third N+ region, the second polycrystalline silicon layer and the second field oxide layer.

11. The transistor structure for electrostatic protection according to claim 6, wherein the transistor structure comprises a first semiconductor structure and a second semiconductor structure, wherein the first semiconductor structure comprises the substrate, the doped region, the first N-type well region, the P-type well region, the first N+ region, the first polycrystalline silicon layer and the first field oxide layer; and the second semiconductor structure comprises the substrate, the doped region, the second N-type well region, the P-type well region, the first P+ region, the second P+ region, the second N+ region, the second polycrystalline silicon layer and the second field oxide layer.

* * * * *